(12) United States Patent
Geva et al.

(10) Patent No.: US 7,186,924 B2
(45) Date of Patent: Mar. 6, 2007

(54) DIELECTRIC STRUCTURE FOR PRINTED CIRCUIT BOARD TRACES

(75) Inventors: Ehood Geva, Palo Alto, CA (US); Todd E. Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 10/690,113

(22) Filed: Oct. 21, 2003

(65) Prior Publication Data

US 2005/0082087 A1    Apr. 21, 2005

(51) Int. Cl.
*H05K 1/00*    (2006.01)
(52) U.S. Cl. .................. 174/258; 174/257; 174/255; 174/262; 174/260
(58) Field of Classification Search ............. 174/36, 174/78, 255, 258, 262, 260
See application file for complete search history.

(56) References Cited

U.S. PATENT DOCUMENTS

| | | | | |
|---|---|---|---|---|
| 4,801,905 A | | 1/1989 | Becker ..................... 333/238 |
| 4,816,616 A | * | 3/1989 | Jones ........................ 174/251 |
| 4,885,431 A | * | 12/1989 | Kawakami et al. ........... 174/36 |
| 5,151,770 A | * | 9/1992 | Inoue ........................ 257/660 |
| 5,165,055 A | | 11/1992 | Metsler ...................... 333/12 |
| 5,166,864 A | | 11/1992 | Chitwood et al. ........... 361/386 |
| 5,196,920 A | * | 3/1993 | Kumamoto et al. ......... 257/798 |
| 5,294,751 A | | 3/1994 | Kamada .................... 174/52.4 |
| 5,315,069 A | | 5/1994 | Gebara ...................... 174/250 |
| 5,386,088 A | | 1/1995 | Gardner ..................... 174/261 |
| 5,426,399 A | * | 6/1995 | Matsubayashi et al. ........ 333/1 |
| 5,572,408 A | | 11/1996 | Anhalt et al. ............... 361/737 |
| 5,586,011 A | | 12/1996 | Alexander .................. 361/818 |
| 5,596,804 A | | 1/1997 | Hogge, Jr. et al. ............ 29/840 |
| 5,677,515 A | * | 10/1997 | Selk et al. .................. 174/255 |
| 5,838,551 A | | 11/1998 | Chan ......................... 361/818 |
| 5,898,576 A | | 4/1999 | Lockwood et al. ......... 361/782 |
| 5,923,232 A | | 7/1999 | Europa et al. .............. 333/204 |
| 6,011,691 A | | 1/2000 | Schreffler ................... 361/704 |
| 6,075,423 A | | 6/2000 | Saunders .................... 333/33 |
| 6,075,700 A | * | 6/2000 | Houghton et al. .......... 361/704 |
| 6,125,042 A | | 9/2000 | Verdi et al. ................. 361/760 |
| 6,157,065 A | * | 12/2000 | Huang et al. ............... 257/355 |
| 6,297,551 B1 | | 10/2001 | Dudderar et al. ........... 257/723 |
| 6,353,189 B1 | * | 3/2002 | Shimada et al. ............ 174/255 |
| 6,385,048 B2 | | 5/2002 | Mellberg et al. ........... 361/704 |
| 6,444,922 B1 | * | 9/2002 | Kwong ...................... 174/261 |
| 6,608,258 B1 | * | 8/2003 | Kwong et al. .............. 174/258 |
| 6,872,595 B1 | * | 3/2005 | Kwong et al. .............. 438/109 |
| 2002/0060090 A1 | * | 5/2002 | Ozeki et al. ................ 174/255 |
| 2002/0074605 A1 | * | 6/2002 | Gamand et al. ............ 257/367 |

* cited by examiner

*Primary Examiner*—Dean A. Reichard
*Assistant Examiner*—Hoa C. Nguyen
(74) *Attorney, Agent, or Firm*—Ido Tuchman; Randall J. Bluestone

(57) ABSTRACT

A trace cover suitable for shielding a conductive trace on a top layer of a circuit board. The trace cover includes a dielectric body disposed substantially over the conductive trace, side shielding perpendicular to the direction of the conductive trace and substantially parallel to the length of the conductive trace, and top shielding disposed on the top surface of the body. The side shielding and top shielding are electrically coupled with the at least one circuit ground of the circuit board.

18 Claims, 5 Drawing Sheets

DIELECTRIC STRUCTURE FOR PRINTED CIRCUIT BOARD TRACES

FIELD OF THE INVENTION

The present invention relates generally to circuit boards, and more specifically to a trace cover configured to help suppress electromagnetic interference from conductive traces on a circuit board.

BACKGROUND

Electronic circuits with high frequency signals on printed circuit boards are sometimes difficult and expensive to design and manufacture. This is due to the fact that high frequency signals carried on traces on the top of circuit boards often transmit electromagnetic interference that can disrupt the normal operation of the circuit.

One solution known in the art for reducing interference emanating from traces carrying high frequency signals is to manufacture circuit boards with high frequency traces isolated between two ground layers within the circuit board. Such a solution, however, can be unsuccessful because it typically requires sending the high frequency signal along a via to an inner board layer. The via may create more interference by acting as an antenna and transmitting electromagnetic interference through the circuit, especially if the via leaves an open stub. Open stubs can be eliminated by using blind vias and buried vias, but such solutions and additional circuit board manufacturing steps and increase manufacturing costs significantly.

Another solution in the art for manufacturing circuit boards with high frequency signals is to use circuit boards made from special dielectric materials configured to suppress electromagnetic interference. A shortcoming of this solution is that it generally adds substantial manufacturing costs to the circuit. Using expensive circuit board material is especially unfavorable when there are only a small number of high frequency signals radiating electromagnetic interference through the circuit.

SUMMARY OF THE INVENTION

The present invention addresses the above-mentioned limitations of traditional circuit boards by providing a trace cover configured to suppress electromagnetic interference radiated from a conductive trace on the top surface of a circuit board. The trace cover, in combination with the circuit board, helps prevent electromagnetic interference from being radiated from the conductive trace carrying high-frequency signals and helps increase the circuit's reliability without the need for signal vias.

Thus, one aspect of the invention is a trace cover suitable for shielding a conductive trace on a top layer of a circuit board. The trace cover includes a body composed of a dielectric substrate and is configured to be disposed substantially over the conductive trace. The trace cover further includes top shielding disposed on the top surface of the body and is electrically coupled with at least one circuit ground of the circuit board. The trace cover may further include side shielding disposed perpendicular to the direction of the conductive trace and substantially parallel to the length of the conductive trace and is electrically coupled with at least one circuit ground of the circuit board.

Another aspect of the invention is a circuit board including an outer layer, a conductive trace disposed on the outer layer, and at least one circuit ground. A trace cover is disposed substantially over the conductive trace. The trace cover includes a dielectric body, top shielding disposed over the body, and side shielding substantially parallel to the path of the conductive trace. The top shielding and side shielding are coupled to the circuit board's circuit ground. The circuit board further includes an inner board layer vertically offset from the outer board layer. The inner board layer includes a ground plate vertically offset from the conductive trace and coupled to the circuit ground. A plurality of board vias are also present in the circuit board and electrically couple the board ground plate to the ground of the trace cover, without the need for signal vias.

A further aspect of the invention is a trace cover suitable for suppressing electromagnetic emissions from a conductive bus on a circuit board. The conductive bus includes at least two substantially parallel bus traces and the circuit board includes at least one circuit ground. The trace cover comprises a dielectric body configured to be disposed substantially over the conductive bus. Side shielding on the trace cover may be disposed perpendicular to the direction of the conductive trace and substantially parallel to the length of the bus traces and electrically coupled with the circuit board's circuit ground. Top shielding is disposed on the top surface of the body and is electrically coupled with the circuit ground. Bus shielding may be disposed between the bus traces and also electrically coupled with the circuit ground.

Yet another aspect of the invention is a method for assembling a circuit board having at least one high frequency conductive trace and at least one circuit ground. The method includes receiving the circuit board and attaching a trace cover to the circuit board. The trace cover is disposed substantially over the conductive trace and includes a dielectric body, top shielding disposed over the body, and side shielding substantially parallel to the path of the conductive trace. The top shielding and side shielding are coupled to the circuit ground.

The foregoing and other features, utilities and advantages of the invention will be apparent from the following more particular description of various embodiments of the invention as illustrated in the accompanying drawings.

DETAILED DESCRIPTION OF THE INVENTION

Figure 1:
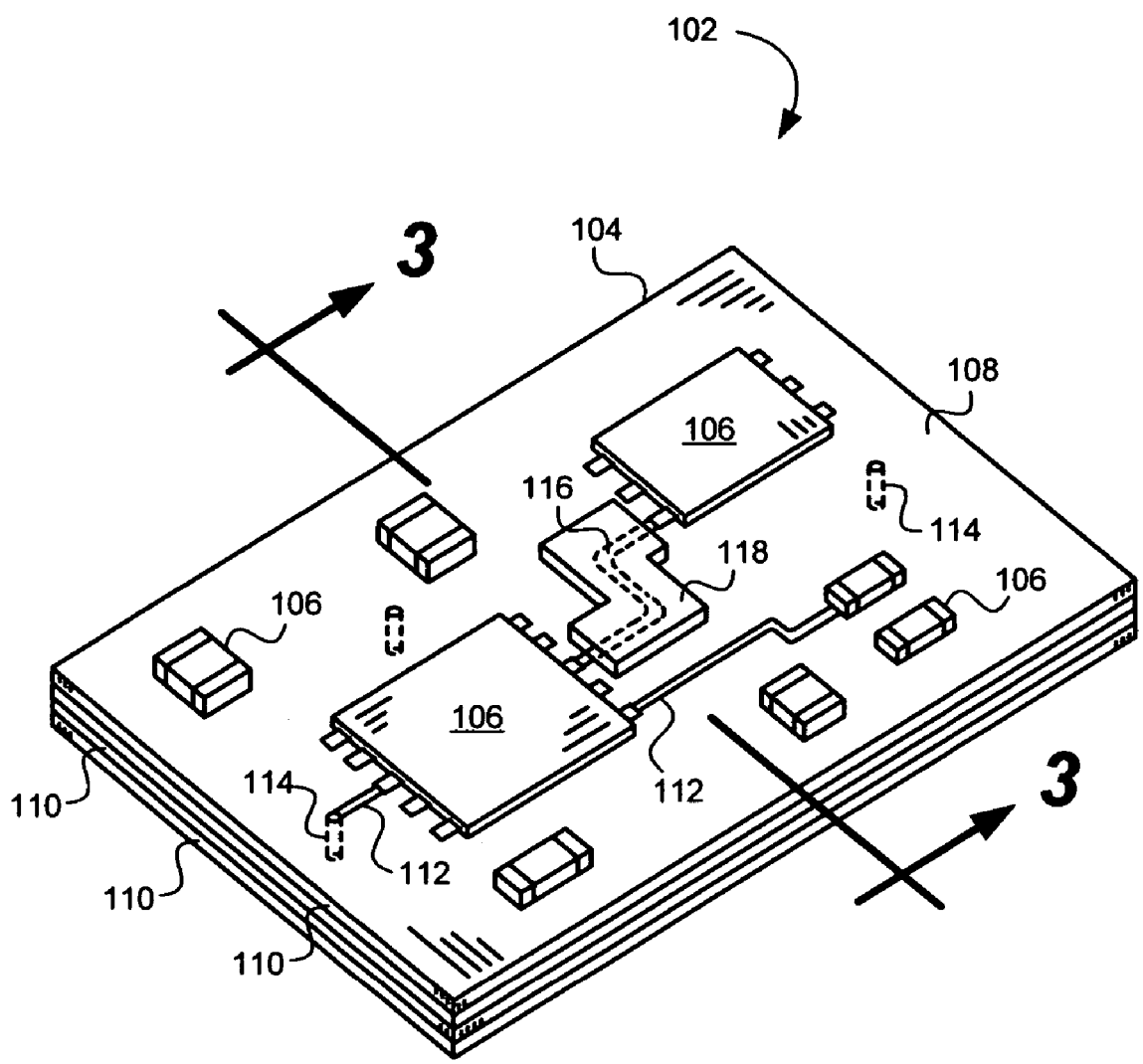
FIG. 1 shows an exemplary circuit embodying the present invention.

The following description details how the present invention is beneficially employed to suppress electrical interference from conductive traces on circuit boards, especially from traces carrying high-frequency signals. Throughout the description of the invention reference is made to FIGS. 1–5. When referring to the figures, like structures and elements shown throughout are indicated with like reference numerals.

In FIG. 1, an exemplary electric circuit 102 employing the present invention is shown. It is initially noted that the electric circuit 102 is presented for illustration purposes only, and is representative of countless configurations in which the invention may be implemented. Thus, the present invention should not be construed as limited to the configurations shown in the figures herein.

The electric circuit 102 includes a circuit board 104 with various components 106 soldered to a top surface 108 of the board 104. The circuit board 104 includes several board layers 110 (also known as laminates) stacked on top of each other. Conductive traces 112 running along the surfaces of the circuit board 104 electrically couple the components 106 together. Conductive traces 112 on different layers 110 are connected together through conductive vias 114 that run perpendicular to the surface of the circuit board 104 and through the board layers 110.

In accordance with the present invention, the circuit board 104 includes at least one conductive trace 116 on the top (or bottom) surface 108 requiring electromagnetic shielding. The conductive trace 116 may, for example, pass a high frequency signal between two circuit components 106 and therefore radiates electromagnetic interference. Without shielding, the conductive trace 116 would transmit too much interference to other conductive traces 112 and components 106, rendering the electric circuit 102 unusable or unreliable.

To suppress the electromagnetic interference emanating from the conductive trace 116, a trace cover 118 is disposed substantially over the conductive trace 116. As described in detail below, the trace cover 118, together with the circuit board 104, forms ground shielding around the conductive trace 116. The trace cover 116 may be soldered to the circuit board 104 in the same process step as other components, and can be assembled by a pick and place machine.

The trace cover 118 makes it possible to use the outer layer of the circuit board 104 for high data rate without any high frequency via lines. The trace cover 118 allows a board designer to make short connection traces between two devices on the top surface 108 of the board. Moreover, the combination of the trace cover 116 and circuit board 104 helps prevent electromagnetic interference from being radiated from the conductive trace 116 and helps increase the circuit's reliability.

Figure 2:
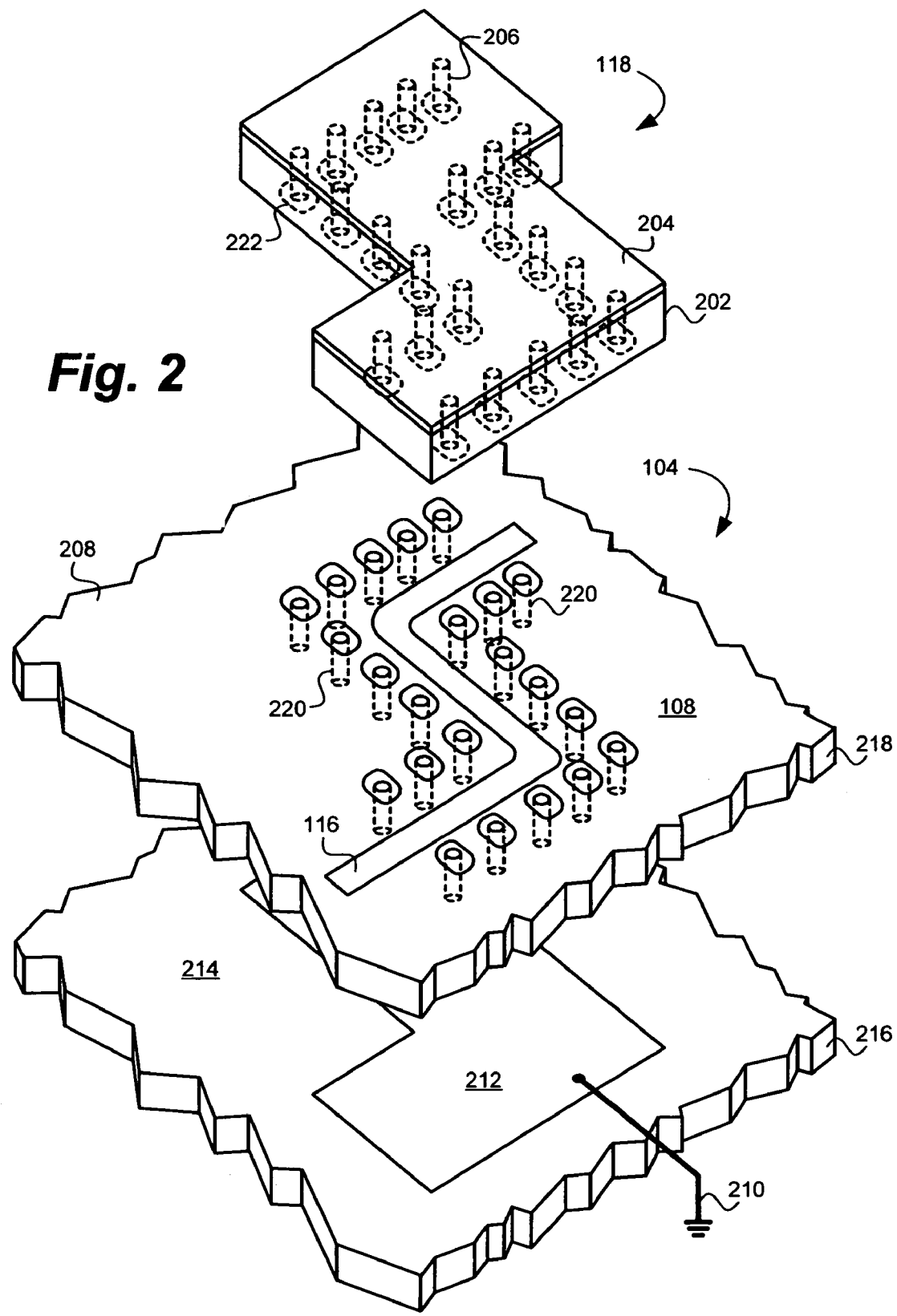
FIG. 2 shows an exploded view of a trace cover and a portion of the circuit board, as contemplated by one embodiment of the present invention.

FIG. 2 shows an exploded view of the trace cover 118 and circuit board 104 in accordance with one embodiment of the invention. As mentioned above, the trace cover 118 is disposed substantially over the conductive trace 116. Thus, the trace cover 118 is shaped to follow the path of the conductive trace 116. Only small portions at the ends of the trace 116 may remain uncovered by the trace cover 118.

The trace cover 118 includes a body 202, top shielding 204, and side shielding 206. The body 202 is composed of a dielectric substrate that forms the basic shape of the trace cover 118. It is contemplated that the body 202 may be manufactured using either the same or different material as the circuit board substrate 208. The body 202 may, for example, be composed of fiberglass (such as FR4), ceramic, woven glass (such as DUROID(R)), composite materials, and other known rigid, flexible, and semi-flexible materials. DURDOID is a registered trademark of Rogers Corporation. The specific material used for the body 202 is a matter of design choice dependent on the performance requirements of the trace cover 118.

The top shielding 204 is disposed on the top surface of the body 202 and is electrically coupled with the circuit ground 210 from the circuit board 104. For example, the top shielding 204 may be coupled to the circuit ground 210 through the side shielding 206. In a particular embodiment of the invention, the top shielding 204 is a conductive plating on the top surface of the body 202. The top shielding 204 may be a solid or patterned plated surface.

As used herein, the circuit ground 210 may originate from various power supply sources. For example, a power supply may provide various supply voltages and each of these voltages may have its own ground. Thus, the circuit ground 210 may include any available supply ground, as well as any signal ground specifically for the conductive trace 116.

The side shielding 206 is disposed between the top and bottom surfaces of the trace cover 118 and runs substantially parallel to the length of the conductive trace 116. The side shielding 206 is also electrically coupled with the circuit ground 210 from the circuit board 104. In one configuration of the trace cover 118, the side shielding 206 may include a plurality of cover vias perpendicular to the conductive trace 116 and spaced along both sides of the conductive trace path. In a particular embodiment of the invention, the cover vias are spaced approximately one-quarter inch apart. It is contemplated that the side shielding 206 may be constructed as a solid or patterned plated surface along the sides of the body 202 (see FIG. 5).

To suppress the electromagnetic interference radiated from the conductive trace 116, the trace cover 118, in combination with the circuit board 104, forms a ground cage around the conductive trace 116. More specifically, the conductive trace 116 is interposed between the trace cover 118 and a circuit board ground plate 212 coupled to the circuit ground 210. Typically, the ground plate 212 is disposed on the top surface 214 of the second inner board layer 216 directly below an outer board layer 218. It is contemplated that the ground plate 212 may be located on other inner board layers.

Board vias 220 running substantially parallel to the length of the conductive trace 116 are configured to provide shielding between the trace cover 118 and ground plate 212. The board vias 220 may also be configured to electrically couple the ground plate 212 with the trace cover 118. Connecting pads 222 on the bottom of the trace cover 118 may be used to connect the side shielding 206 with the board vias 220. As with the top shielding 204, the ground plate may be a solid or patterned plated surface.

Figure 3:
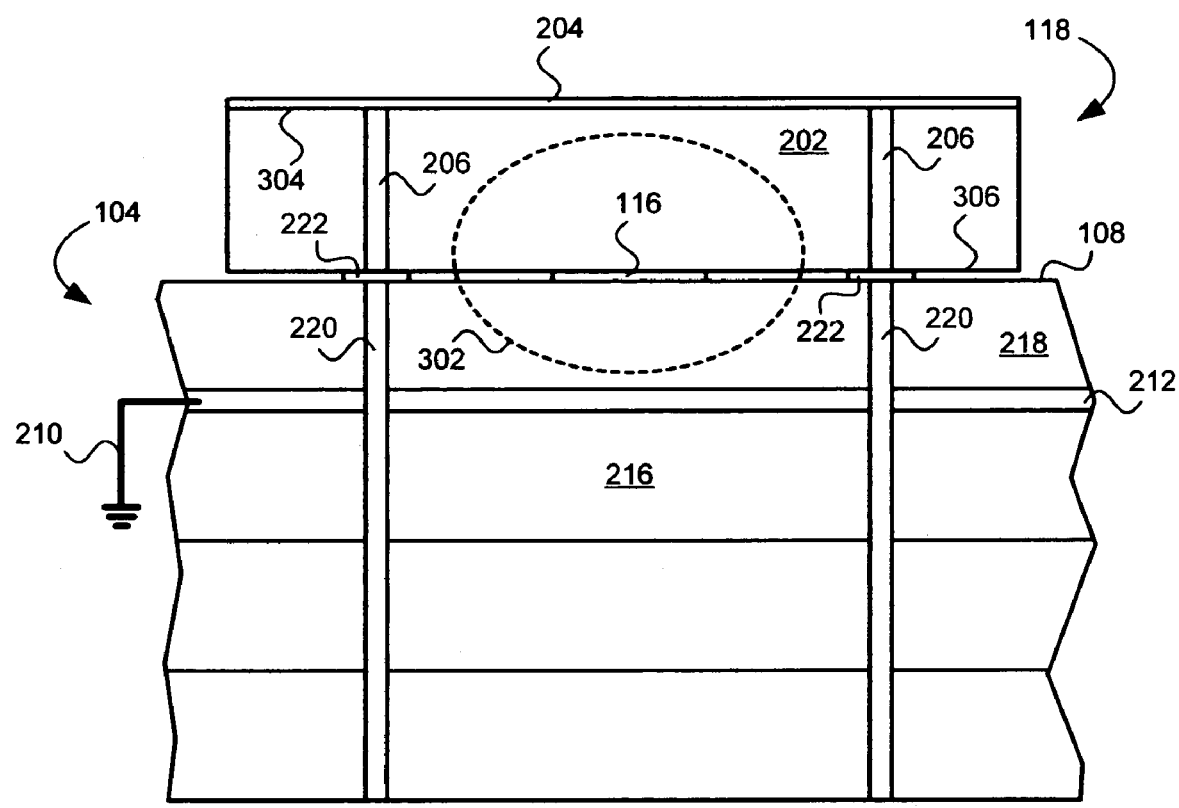
FIG. 3 shows a cross sectional view of the circuit along section line 3—3 of FIG. 1.

FIG. 3 shows a cross sectional view of the circuit along section line 3—3 of FIG. 1. As discussed above, the trace cover 118 and circuit board 104 are configured to surround the conductive trace 116 with ground shielding 302.

The trace cover 118 includes a dielectric body 202 having a top surface 304 and a bottom surface 306. The trace cover 118 contains top shielding 204 disposed on the top surface 304 of the body 202. In one embodiment of the invention, the trace cover 118 provides side shielding 206 between the top surface 304 and bottom surface 306 of the body 202. The side shielding 206 is placed on both sides of the conductive trace 116 and is substantially parallel to the path of the conductive trace 116.

The top shielding 204 and side shielding 206 are electrically coupled with the circuit ground 210 of the circuit board 104. In one embodiment of the invention, top shielding 204 and side shielding 206 are electrically coupled with the circuit ground 210 along connecting pads 222 attached to the bottom surface 306 of the body 202. The connecting pads 222 are configured to electrically couple the trace cover 118 to board vias 220 on the top surface 108 of the circuit board 104. In addition, the board vias 220 are electrically coupled to a ground plate 212 on a second board layer 216. The ground plate is located under the conductive trace 116 and is electrically coupled to the circuit ground 210.

The invention beneficially eliminates the need for high-frequency vias because such signals remain on the top surface 108 of the circuit board. By eliminating high-frequency vias, substantially less noise is emitted from the signal. Furthermore, manufacturing costs are reduced since high-frequency blind vias are not required to reduce radiated electromagnetic interference. It is noted that the board vias 220 may run through all the circuit board layers or only a portion of the layers. In addition, the trace cover 118 is inexpensive to implement and has low electrical discontinuities.

In a particular embodiment of the invention, the vertical distance between the top shielding 204 and the conductive trace 116 is substantially equal to the vertical distance between the conductive trace 116 and the ground plate 212. Such an arrangement offers increased shielding around the conductive trace 116.

Figure 4:
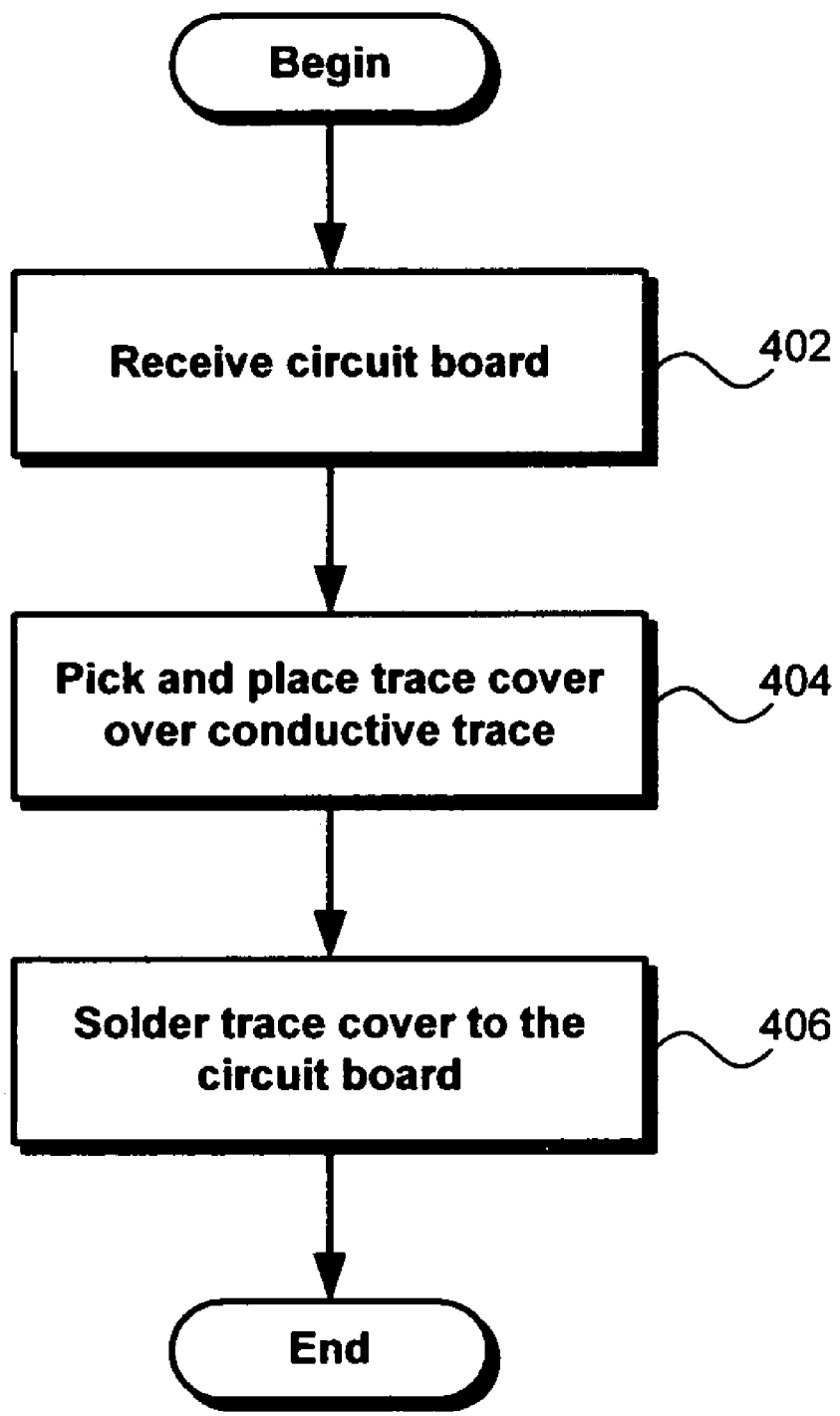
FIG. 4 shows an exemplary circuit assembling process contemplated by the present invention.

In FIG. 4, an exemplary circuit board assembling process contemplated by the present invention is shown. The process begins at receiving operation 402. During this operation, the circuit board is received by a machine or technician with access to at least one trace cover described above. The circuit board includes at least one conductive trace requiring shielding and at least one circuit ground. As mentioned above, the conductive trace may, for example, be a conductor configured to carry a high frequency signal. Once receiving operation 402 is completed, control passes to placing operation 404.

At placing operation 404, a trace cover is selected and placed substantially over the conductive trace. As mentioned above, the trace cover, along with the circuit board, is configured to provide electromagnetic shielding to the conductive trace. The trace cover includes side shielding substantially parallel to the path of the conductive trace and top shielding disposed on the top of the trace cover. Once placing operation 404 is completed, control passes to attaching operation 406.

At attaching operation 406, the trace cover is attached to the circuit board. In one embodiment of the invention, the trace cover is soldered to the top surface of circuit board such that the trace cover is electrically coupled with the circuit board's circuit ground. Once the attaching operation 406 is completed, the manufacturing process ends.

Figure 5:
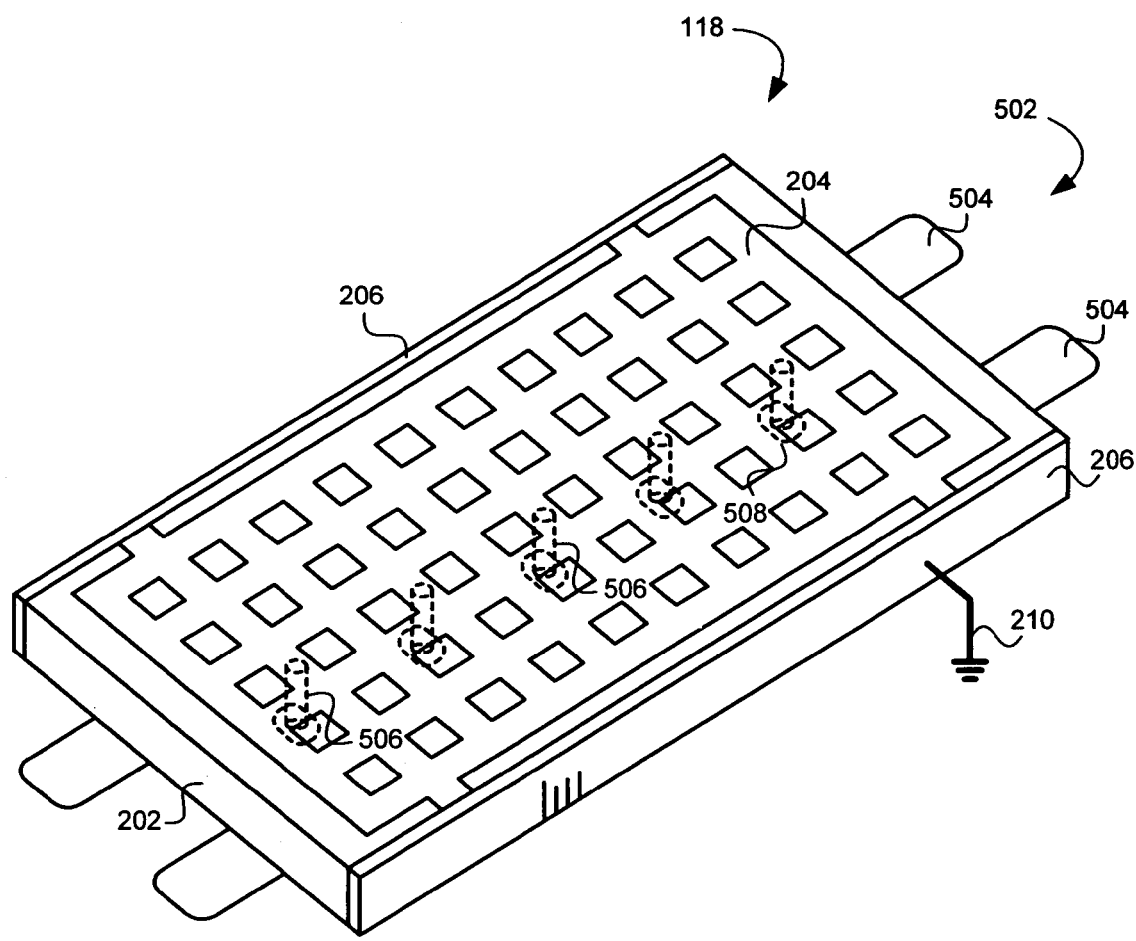
FIG. 5 shows exemplary trace cover contemplated by the present invention for use on high frequency bus traces.

FIG. 5 shows another embodiment of a trace cover 118 contemplated by the present invention. In this configuration, the trace cover 118 is constructed to shield a conductive bus 502 comprising of at least two conductive bus traces 504. The trace cover 118 is disposed substantially over the conductive bus 502 and, as discussed above, includes a dielectric body 202, top shielding 204 and side shielding 206. As show, the side shielding may be implemented as side metal plating. In one embodiment of the invention, the conductive bus 502 is a differential pair of conductors.

The trace cover 118 may optionally include bus shielding 506 disposed within the body 202 and between the bus traces 504, thereby shielding the bus traces 504 from one another. In one embodiment of the invention, the bus shielding 506 includes a plurality of bus vias disposed substantially parallel to the path of the conductive bus 502. The bus shielding vias should normally be positioned far away from the traces 504, if they are needed. The bus shielding 506 is electrically coupled with the at least one circuit ground 210 of the circuit board 104. The bus shielding 506 may include connecting pads 508 configured to electrically couple the bus shielding 506 with the circuit ground 210. It is noted that the bus shielding 506 may be undesirable when the conductive bus 502 is configured as a differential pair. Moreover, the top shielding 204 and/or side shielding 206 may be electrically coupled to the circuit ground 210 through the bus shielding 506.

The foregoing description of the invention has been presented for purposes of illustration and description. It is not intended to be exhaustive or to limit the invention to the precise form disclosed, and other modifications and variations may be possible in light of the above teachings. For example, the invention may be implemented with the trace cover disposed on the bottom side of the circuit board. Thus, embodiments disclosed were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

The invention claimed is:

1. A trace cover suitable for shielding a conductive trace on a circuit board, the circuit board includes at least one circuit ground, the trace cover comprising:
   a body composed of a dielectric substrate, the body having a top surface, a bottom surface and side surfaces, the bottom surface of the body configured to be disposed substantially over the conductive trace; and
   top shielding disposed on the top surface of the body, the top shielding configured to be electrically coupled with the at least one circuit ground of the circuit board; and
   wherein the trace cover is configured to be fixed to an at least partially exposed circuit board surface; and
   wherein the trace cover is separate from the circuit board and is configured to be attachable to the circuit board during circuit board component attachment.

2. The trace cover of claim 1, further comprising side shielding perpendicular to the direction of the conductive trace and substantially parallel to the length of the conductive trace, the side shielding configured to be electrically coupled with the at least one circuit ground of the circuit board.

3. The trace cover of claim 2, further comprising at least one connecting pad disposed on the bottom surface of the body, the connecting pad configured to be soldered to a top surface of the circuit board and to electrically couple the side shielding with the at least one circuit ground.

4. The trace cover of claim 2, wherein the side shielding includes a plurality of conductive vias disposed between the top surface and bottom surface of the body.

5. The trace cover of claim 2, wherein the side shielding includes a conductive plating disposed along the side surfaces of the body.

6. The trace cover of claim 4, wherein the plurality of conductive vias are spaced approximately one-quarter inch apart.

7. The trace cover of claim 1, wherein the top shielding is a conductive plating.

8. The trace cover of claim 1, wherein the top shielding is electrically coupled to the circuit ground through the side shielding.

9. The trace cover of claim 1, wherein the dielectric substrate of the body is different than a dielectric substrate of the circuit board.

10. The trace cover of claim 1, wherein the trace cover is mechanically attached to a top surface of the circuit board after manufacture of the circuit board.

11. The trace cover of claim 1, wherein the circuit board includes a plurality of circuit components mounted thereon.

12. A trace cover suitable for suppressing electromagnetic emissions from a conductive bus on a circuit board, the conductive bus including at least two substantially parallel bus traces, the circuit board including a partially exposed circuit board surface and at least one circuit ground, the trace cover comprising:
   a body composed of a dielectric substrate, the body having a top surface, a bottom surface and side surfaces, the bottom surface of the body configured to be disposed substantially over the conductive bus and on the partially exposed circuit board surface;
   side shielding perpendicular to the direction of the conductive bus and substantially parallel to the length of the conductive bus, the side shielding being electrically coupled with the at least one circuit ground of the circuit board; and
   top shielding disposed on the top surface of the body, the top shielding being electrically coupled with the at least one circuit ground of the circuit board; and
   wherein the trace cover is separate from the circuit board and is configured to be attachable to the circuit board during circuit board component attachment.

13. The trace cover of claim 12, further comprising bus shielding disposed within the body and between the bus traces, the bus shielding being electrically coupled with the at least one circuit ground of the circuit board.

14. The trace cover of claim 13, further comprising at least one connecting pad disposed on the bottom surface of the body, the connecting pad configured to coupled the bus shielding with the at least one circuit ground.

15. The trace cover of claim 13, wherein the bus shielding includes a plurality of conductive vias disposed between the top surface and bottom surface of the body.

16. The trace cover of claim 13, wherein the bus shielding is coupled to the circuit ground through the side shielding.

17. The trace cover of claim 12, wherein the side shielding includes a conductive plating disposed along side surfaces of the body.

18. The trace cover of claim 12, wherein the circuit board includes a plurality of circuit components mounted thereon.

* * * * *